United States Patent
Wu et al.

(10) Patent No.: US 11,520,244 B2
(45) Date of Patent: Dec. 6, 2022

(54) OPTICAL ELEMENT DRIVING MECHANISM

(71) Applicant: TDK TAIWAN CORP., Taoyuan (TW)

(72) Inventors: Fu-Yuan Wu, Taoyuan (TW); Chen-Chi Kuo, Taoyuan (TW); Sin-Jhong Song, Taoyuan (TW)

(73) Assignee: TDK TAIWAN CORP., Taoyuan (TW)

( * ) Notice: Subject to any disclaimer, the term of this patent is extended or adjusted under 35 U.S.C. 154(b) by 0 days.

(21) Appl. No.: 16/433,777

(22) Filed: Jun. 6, 2019

(65) Prior Publication Data
US 2019/0285994 A1 Sep. 19, 2019

Related U.S. Application Data

(63) Continuation of application No. 15/658,967, filed on Aug. 24, 2017, now abandoned.
(Continued)

(30) Foreign Application Priority Data

Jul. 27, 2017 (TW) .................................. 106125254

(51) Int. Cl.
*G02B 27/64* (2006.01)
*G03F 7/20* (2006.01)
(Continued)

(52) U.S. Cl.
CPC ......... *G03F 7/70825* (2013.01); *G02B 7/005* (2013.01); *G02B 7/08* (2013.01);
(Continued)

(58) Field of Classification Search
None
See application file for complete search history.

(56) References Cited

U.S. PATENT DOCUMENTS

2015/0098003 A1   4/2015  Liang et al.
2016/0313628 A1*  10/2016 Brodie ..................... G03B 3/10
(Continued)

FOREIGN PATENT DOCUMENTS

| CN | 105187697 A | 12/2015 |
| TW | 201239501 A | 10/2012 |
| TW | 201414296 A | 4/2014 |

OTHER PUBLICATIONS

An Office Action issued in TW Application No. 106125254, which corresponds to the parent U.S. Appl. No. 15/685,967, dated Jun. 14, 2018.

*Primary Examiner* — Christopher Stanford
*Assistant Examiner* — Journey F Sumlar
(74) *Attorney, Agent, or Firm* — Muncy, Geissler, Olds & Lowe, P.C.

(57) ABSTRACT

An optical element driving mechanism is provided. The optical element driving mechanism includes a first holder, a second holder, a plate, a biasing assembly, and an electromagnetic driving assembly. The first holder holds a first optical element with a first optical axis. The second holder holds a second optical element with a second optical axis. The plate is disposed below the first holder and the second holder. The biasing assembly forces the first holder to move relative to the plate on a plane substantially perpendicular to the first optical axis, and includes a biasing element, wherein when a driving signal is applied to the biasing element, a length of the biasing element is changed. The electromagnetic driving assembly forces the second holder to move relative to the plate and comprising a first magnetic element and a coil.

19 Claims, 10 Drawing Sheets

Related U.S. Application Data

(60) Provisional application No. 62/393,471, filed on Sep. 12, 2016.

(51) Int. Cl.
| | | |
|---|---|---|
| *G02B 7/08* | (2021.01) | |
| *H02K 41/02* | (2006.01) | |
| *H04N 5/232* | (2006.01) | |
| *H04N 5/225* | (2006.01) | |
| *G11B 7/09* | (2006.01) | |
| *G02B 7/10* | (2021.01) | |
| *G02B 7/00* | (2021.01) | |
| *H02K 41/035* | (2006.01) | |

(52) U.S. Cl.
CPC ............ *G02B 7/10* (2013.01); *G02B 27/646* (2013.01); *G03F 7/70258* (2013.01); *G11B 7/0935* (2013.01); *H02K 41/02* (2013.01); *H02K 41/0356* (2013.01); *H04N 5/2254* (2013.01); *H04N 5/2257* (2013.01); *H04N 5/2328* (2013.01)

(56) References Cited

U.S. PATENT DOCUMENTS

| | | | | |
|---|---|---|---|---|
| 2016/0341975 | A1* | 11/2016 | Kim | ................... G02B 27/646 |
| 2017/0289455 | A1* | 10/2017 | Hu | ..................... H04N 5/2253 |
| 2018/0048799 | A1 | 2/2018 | Bachar et al. | |
| 2018/0136482 | A1* | 5/2018 | Kuo | .................... G02B 27/646 |

* cited by examiner

OPTICAL ELEMENT DRIVING MECHANISM

CROSS REFERENCE TO RELATED APPLICATIONS

This application is a continuation of application Ser. No. 15/685,967, filed on Aug. 24, 2017, which claims the benefit of U.S. Provisional Application No. 62/393,471, filed Sep. 12, 2016, and claims priority of Taiwan Patent Application No. 106125254, filed Jul. 27, 2017, the entirety of which are incorporated by reference herein.

BACKGROUND

Technical Field

The disclosure relates to an optical element driving mechanism, and in particular to an optical element driving mechanism using a biasing assembly to force optical elements to move.

Description of the Related Art

As technology develops, many electronic devices (such as tablet computers or smartphones) nowadays are being equipped with lens modules and have a camera or video function. When the user of an electronic device equipped with a lens module shakes the device, images captured by the camera via the lens module may turn out blurry. Since the requirements for image quality have increased, it has become more and more important to develop a vibration-proof lens module.

BRIEF SUMMARY

Some embodiments of the disclosure provide an optical element driving mechanism disposed in an electronic device and configured to hold a plurality of optical elements. The optical element driving mechanism includes a plate, a base, a first holder, a second holder, and a biasing assembly. The plate has a central axis and is fixed to a casing of the electronic device. The first holder and the second holder are respectively configured to hold an optical element and disposed on the base. The biasing assembly is connected to the plate and the base, and forces the base, the first holder, and the second holder to move relative to the plate, in order to achieve the function of optical focusing or optical shake compensation.

In an embodiment, the biasing assembly includes a memory alloy material.

In an embodiment, the optical element driving mechanism further includes a first electromagnetic driving assembly disposed over the base, and the first electromagnetic driving assembly drives the first holder to move relative to the base.

In an embodiment, the first electromagnetic driving assembly includes a first coil and a first magnetic element. The first coil is disposed on the first holder, the first magnetic element corresponds to the first coil, and the first magnetic element is not disposed between the first holder and the second holder.

In an embodiment, there is a distance between the first holder and the second holder, and the distance is less than the thickness of the first magnetic element.

In an embodiment, the first electromagnetic driving assembly is only disposed between the first holder and the second holder.

In an embodiment, the biasing assembly includes a first biasing element and a second biasing element, and the base includes a first sub-base and a second sub-base, wherein the first biasing element is connected to the first sub-base, and the second biasing element is connected to the second sub-base.

In an embodiment, the first biasing element and the second biasing element are disposed on a side of the plate, the first biasing element and the second biasing element disposed on the side of the plate have elongated structures, and the long axes of the first biasing element and the second biasing element are parallel to each other.

In an embodiment, the optical element driving mechanism further includes a second electromagnetic driving assembly, and the first sub-base and the second sub-base have the appearances of substantially rectangular structures, wherein the first electromagnetic driving assembly is electrically connected to the first sub-base at a first electrical connection junction of a corner of the first sub-base, and the second electromagnetic driving assembly is electrically connected to the second sub-base at a second electrical connection junction of a corner of the second sub-base.

In an embodiment, the optical element driving mechanism further includes a plurality of first electrical connection junctions and a plurality of second electrical connection junctions, wherein the connecting line of the first electrical connection junctions is substantially parallel to the connecting line of the second electrical connection junctions.

In an embodiment, the optical element driving mechanism further includes a housing, wherein the first holder is disposed in the housing.

In an embodiment, the optical element driving mechanism further includes an elastic element connected to the base and the plate, and the biasing assembly is connected to the elastic element and the plate.

In an embodiment, the elastic element has an L-shaped arm and a protruding portion, the L-shaped arm is connected to the plate, and the protruding portion is connected to the base.

In an embodiment, the plate with a rectangular structure has a fixed portion, the elastic element has a connecting portion, the fixed portion and the connecting portion are disposed on the same side of the plate, and the biasing assembly is connected to the fixed portion and the connecting portion.

In an embodiment, the biasing assembly has a plurality of biasing elements respectively disposed on a plurality of lateral sides of the plate and surrounding the first holder and the second holder.

In an embodiment, the optical element driving mechanism further includes a board disposed in the plate, and the board includes aluminum material.

In an embodiment, when the biasing assembly deforms, the biasing assembly forces the first holder, the second holder, the first optical element, and the second optical element to move together relative to the plate.

In an embodiment, the optical element driving mechanism further includes a common magnetic element disposed between the first holder and the second holder.

Some embodiments of the disclosure provide an optical element driving mechanism. The optical element driving mechanism includes a first holder, a second holder, a plate, a biasing assembly, and an electromagnetic driving assembly. The first holder holds a first optical element with a first optical axis. The second holder holds a second optical element with a second optical axis. The plate is disposed below the first holder and the second holder. The biasing assembly forces the first holder to move relative to the plate on a plane substantially perpendicular to the first optical axis, and includes a biasing element, wherein when a driving signal is applied to the biasing element, a length of the biasing element is changed. The electromagnetic driving assembly forces the second holder to move relative to the plate and comprising a first magnetic element and a coil.

In an embodiment, the optical element driving mechanism further includes a first housing and a second housing. The first housing is configured to contain the first holder, and includes a first top surface and a first side surface. The first side surface extends from an edge of the first top surface in a direction that is different from an extending direction of the first top surface. The second housing is configured to contain the second holder, and includes a second top surface and a second side surface. The second side surface extends from an edge of the second top surface in a direction that is different from an extending direction of the second top surface. As viewed in a direction that the first holder and the second holder are arranged, the first holder, the second holder, the first side surface, and the second side surface partially overlap.

In an embodiment, the first top surface and the second top surface are not in contact, and a gap is formed between the first top surface and the second top surface.

In an embodiment, as viewed in a direction that the first holder and the second holder are arranged, the second housing and the electromagnetic driving assembly partially overlap, and the second housing and the biasing assembly do not overlap.

In an embodiment, as viewed in a direction that is parallel to the first optical axis, the biasing assembly is at least partially located between the first optical axis and the second optical axis, and as viewed in a direction that the first holder and the second holder are arranged, the first optical axis and the second optical axis partially overlap with the biasing assembly.

In an embodiment, as viewed in a direction that is parallel to the first optical axis, the biasing element is at least partially located between the first optical axis and the second optical axis, and as viewed in the direction that the first holder and the second holder are arranged, the first optical axis and the second optical axis partially overlap with the biasing element.

In an embodiment, the first magnetic element has an elongated structure extending along the direction that the first holder and the second holder are arranged.

In an embodiment, the second holder has a polygonal structure, the electromagnetic driving assembly further comprises a second magnetic element, and the first magnetic element and the second magnetic element are disposed on different sides of the second holder.

In an embodiment, a volume of the first magnetic element is different from a volume of the second magnetic element.

In an embodiment, the volume of the first magnetic element is greater than the volume of the second magnetic element.

In an embodiment, the biasing assembly is configured to force the first holder to move relative to the plate in a first direction, the electromagnetic driving assembly is configured to force the second holder to move relative to the plate in a second direction, and the first direction is not parallel to the second direction.

In an embodiment, the first optical axis is separated from the second optical axis.

In an embodiment, the first sub-base and the second sub-base are individually movable relative to the plate.

BRIEF DESCRIPTION OF THE DRAWINGS

The disclosure can be more fully understood by reading the subsequent detailed description and examples with references made to the accompanying drawings, wherein.

DETAILED DESCRIPTION OF THE INVENTION

The optical element driving mechanisms of some embodiments of the present disclosure are described in the following description. However, it should be appreciated that the following detailed description of some embodiments of the disclosure provides various inventive concepts which may be performed in widely various specific technical fields. The specific embodiments disclosed are provided merely to clearly describe the invention and some specific methods without limiting the scope of the invention.

Unless defined otherwise, all terms (including technical and scientific terms) used herein have the same meaning as commonly understood by one of ordinary skill in the art to which this disclosure belongs. It should be appreciated that, in each case, the term, which is defined in a commonly used dictionary, should be interpreted as having a meaning that conforms to the relative skills of the present disclosure and the background or the context of the present disclosure, and should not be interpreted in an idealized or overly formal manner unless so defined in the present disclosure.

Figure 1:
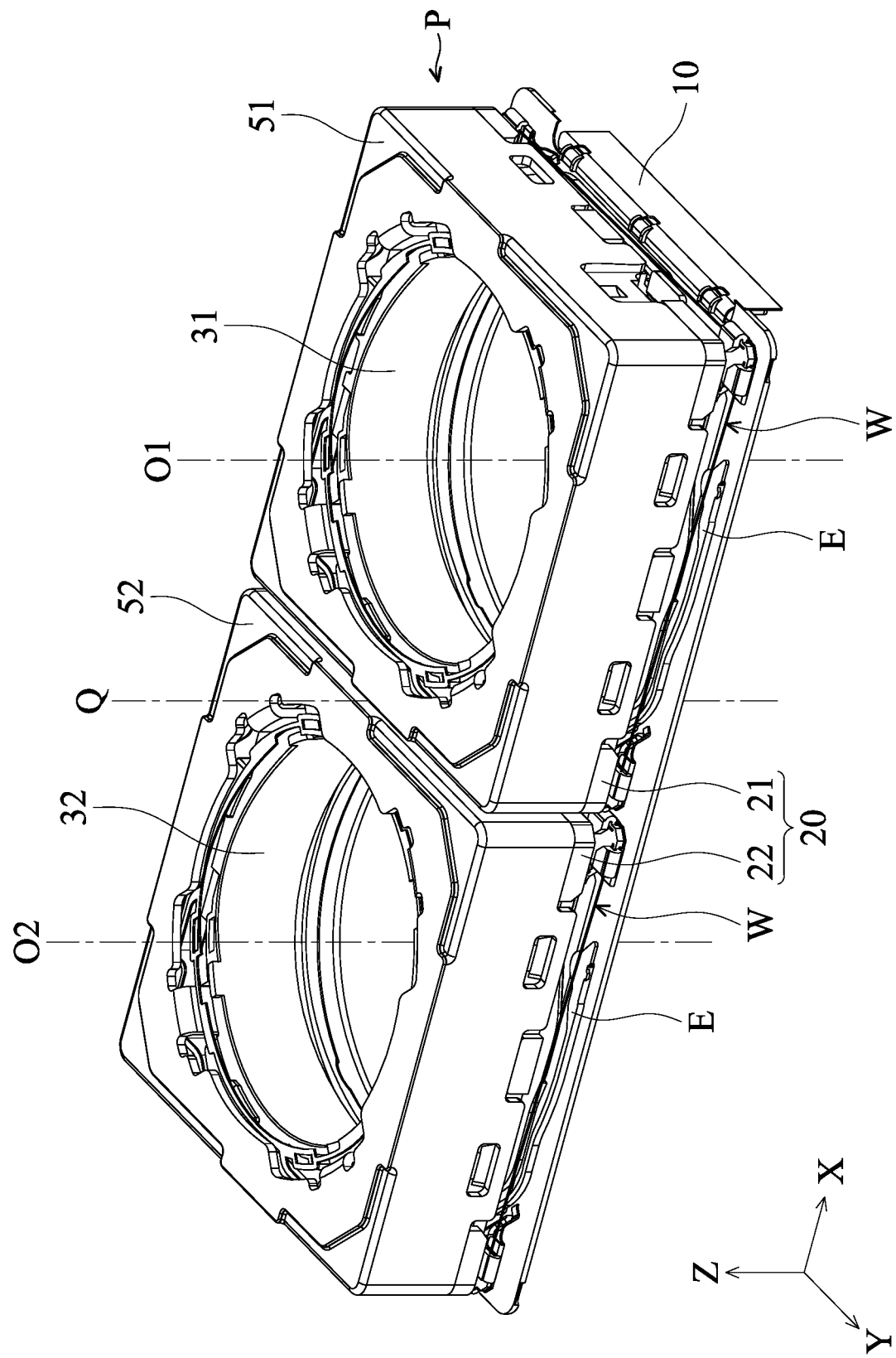
FIG. 1 is a schematic perspective view illustrating an optical element driving mechanism in an embodiment of the present disclosure.
Figure 2:
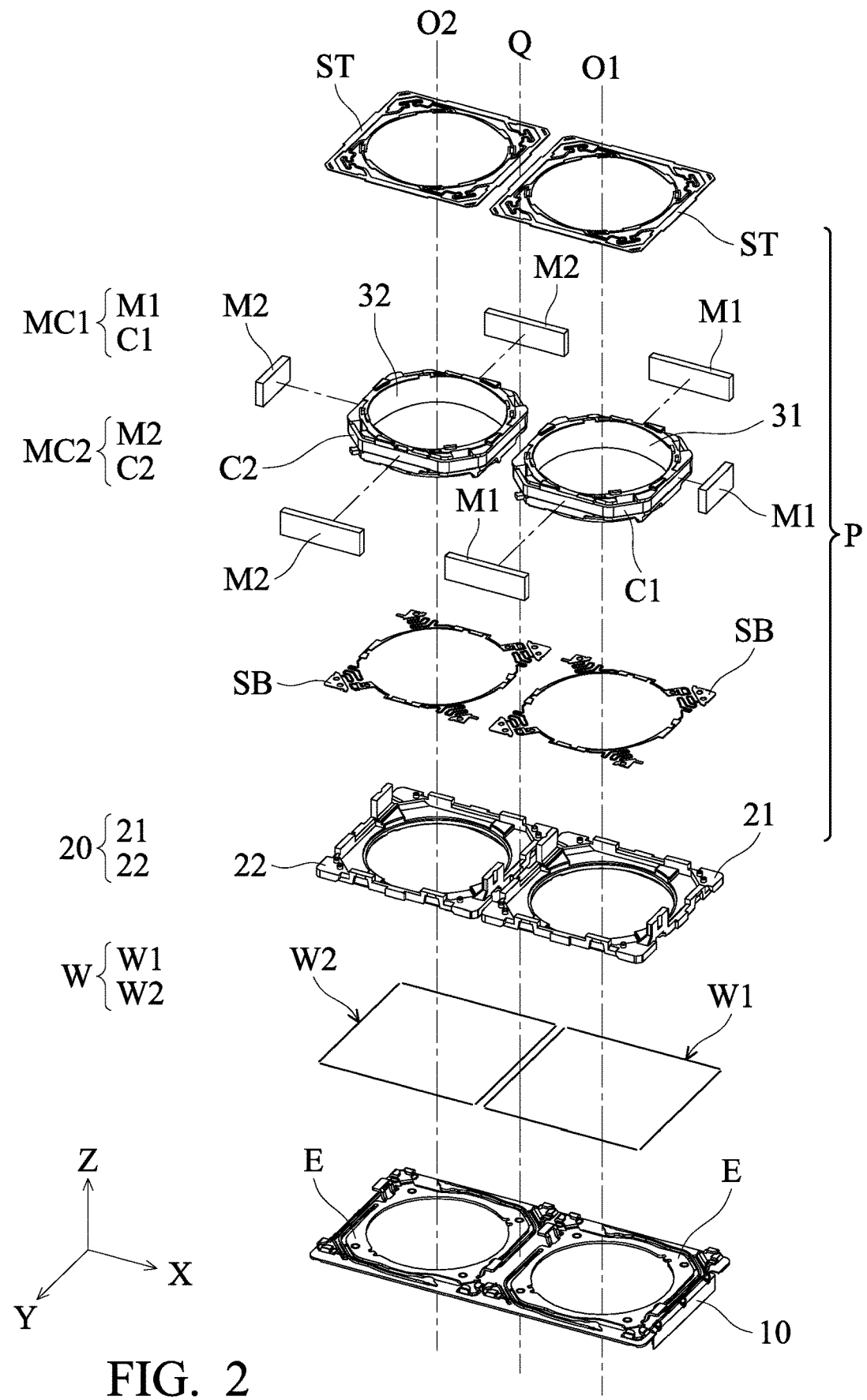
FIG. 2 is an exploded diagram illustrating the optical element driving mechanism in FIG. 1 (wherein the housings 51 and 52 are omitted).

FIG. 1 is a schematic view illustrating an optical element driving mechanism 1 in an embodiment of the present disclosure, and FIG. 2 is an exploded diagram illustrating the optical element driving mechanism 1 in FIG. 1. The optical element driving mechanism 1, for example, can be disposed inside an electronic device such as a camera, a tablet computer or a cell phone, and can be used to hold a plurality of optical elements (for example, optical lenses, not shown). The optical element driving mechanism 1 can force the optical elements to move relative to a photosensitive element (not shown) in the electronic device to achieve the goal of auto-focusing (AF) or optical image stabilization (OIS), thereby the image quality is enhanced. In the embodiment, the optical element driving mechanism 1 can be used to hold dual optical elements.

As shown in FIGS. 1 and 2, the optical element driving mechanism 1 mainly includes a movable portion P, a plate 10, a biasing assembly W, and two elastic elements E, wherein the movable portion P includes a base 20, a first holder 31, a second holder 32, a first electromagnetic driving assembly MC1, a second electromagnetic driving assembly MC2, and two housings 51 and 52. The plate 10 is fixed to a casing of the electronic device. The base 20 includes two sub-bases 21 and 22, and is connected to the plate 10 by the biasing assembly W and the elastic elements E. The first holder 31 and the first electromagnetic driving assembly MC1 are disposed on the sub-base 21 of the base 20, and the second holder 32 and the second electromagnetic driving assembly MC2 are disposed on the sub-base 22 of the base 20. Each of the first holder 31 and the second holder 32 holds one respective optical element (the first optical element and the second optical element), respectively (not shown) through the accommodating spaces of the first holder 31 and the second holder 32, and a photosensitive element (not shown) of the electronic device is used to receive the light from outside passing through the optical elements to capture images. The plate 10 has a central axis Q. When the optical elements are in an initial position, the central axis Q is parallel to the optical axes O1 and O2 of the optical elements. The housings 51 and 52 are disposed on the base 20 and surround the first holder 31 and the second holder 32 to protect them. The connection relationship between the plate 10 and the base 20 of the movable portion P is described as follows.

Figure 3:
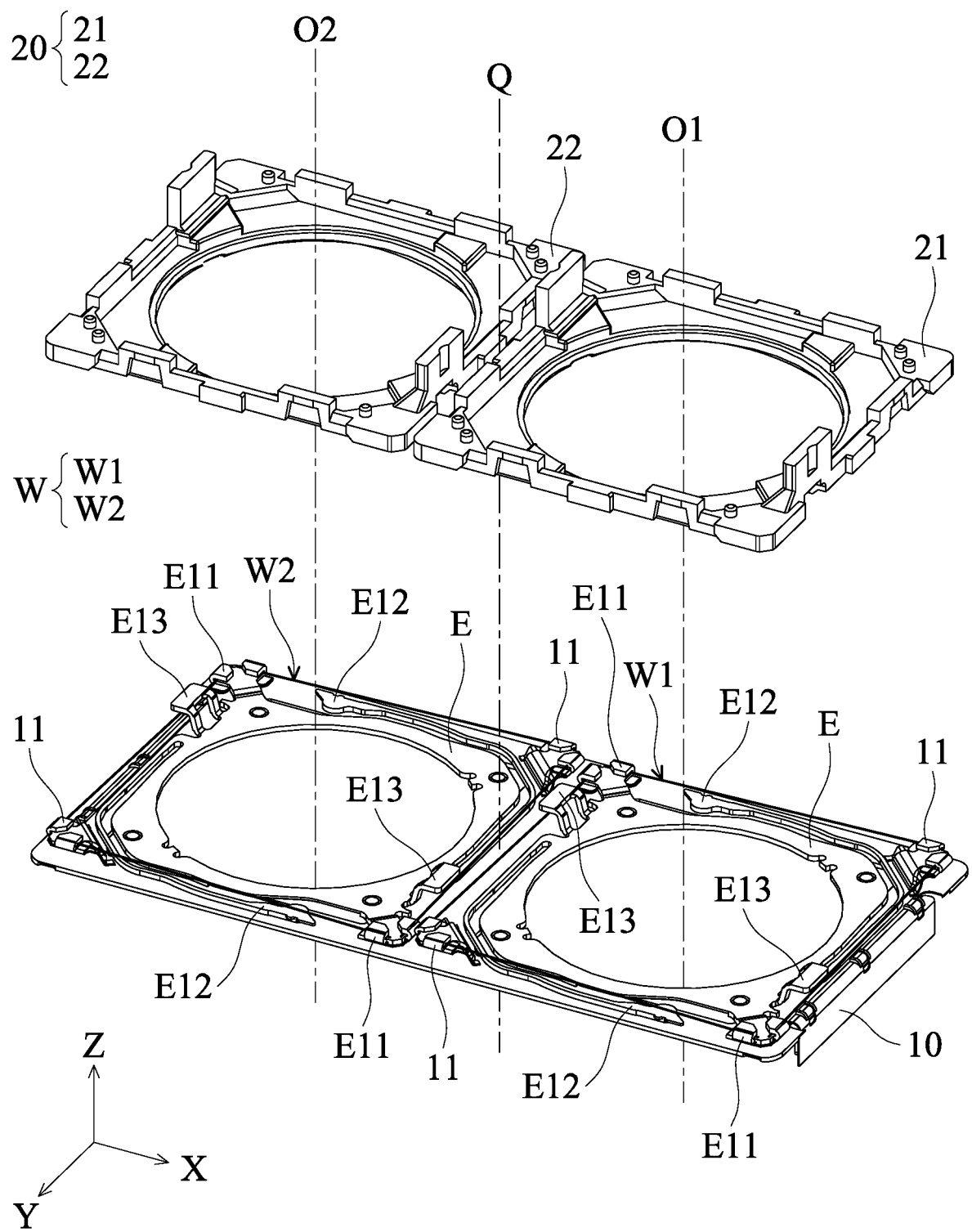
FIG. 3 is a schematic perspective view illustrating the plate, the elastic elements, the biasing assembly, and the base in FIG. 2.

FIG. 3 is a schematic view illustrating that the base 20 is connected to the plate 10. As shown in FIG. 3, the plate 10 can be a printed circuit board disposed below the base 20. A plurality of elastic elements E are disposed on the plate 10 and positioned between the plate 10 and the base 20. The plate 10 can be connected to the base 20 by the biasing assembly W and the elastic elements E.

Figure 4:
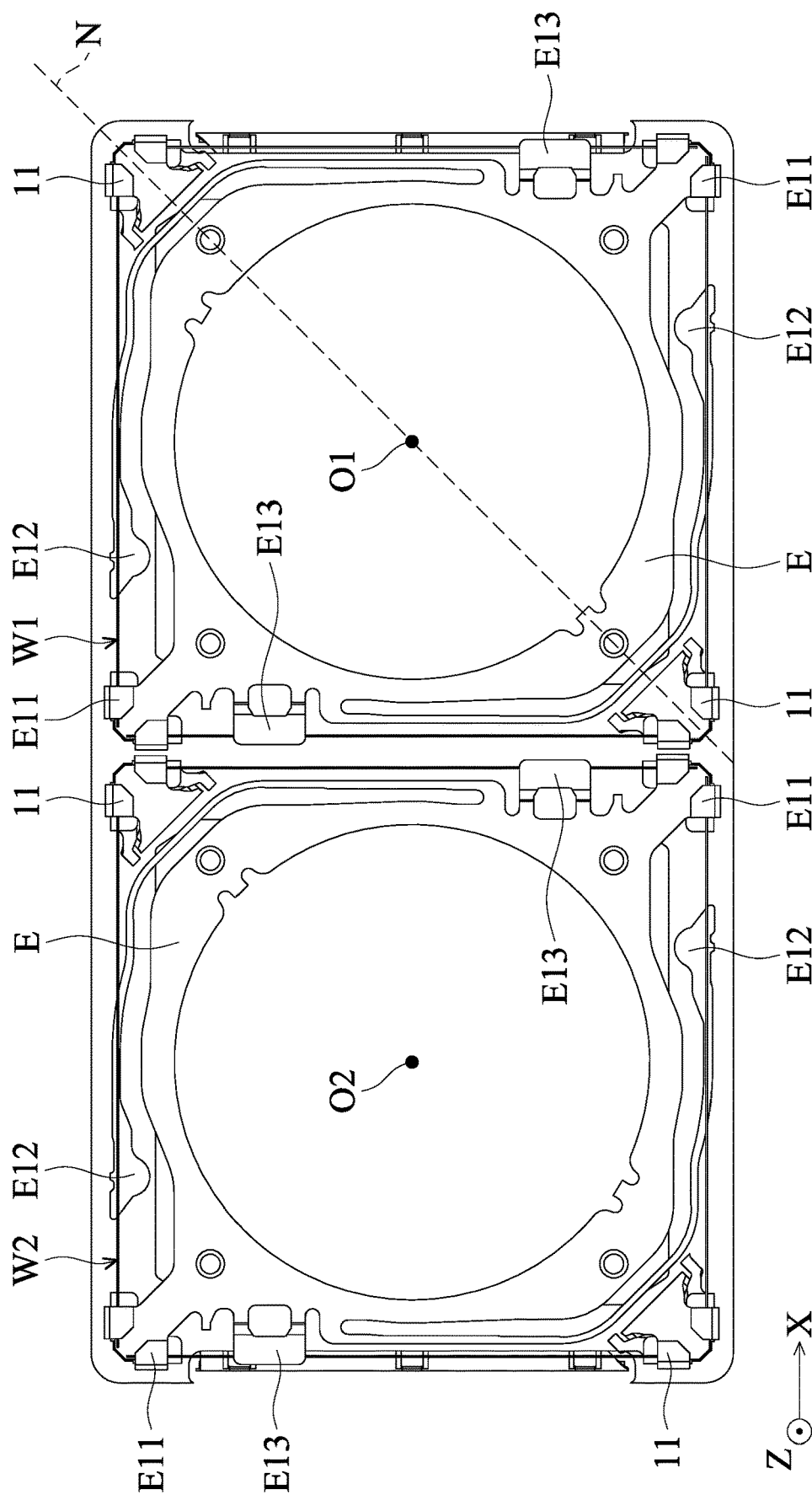
FIG. 4 is a top view illustrating the plate, the elastic elements, and the biasing assembly in FIG. 3.

In particular, as shown in FIGS. 3 and 4, the biasing assembly W includes four first biasing elements W1 disposed corresponding to the four lateral sides of the sub-base 21, and four second biasing elements W2 disposed corresponding to the four lateral sides of the sub-base 22. The two ends of each of the first biasing elements W1 are respectively connected to fixed portions 11 of the plate 10 and connecting portions E11 of the elastic elements E, and the two ends of each of the second biasing elements W2 are also respectively connected to fixed portions 11 of the plate 10 and connecting portions E11 of the elastic elements E. The fixed portions 11 and the connecting portions E11 extend in the direction of the optical axes O1 and O2 (Z-axis) of the optical elements. The elastic elements E are disposed between the plate 10 and the base 20, and connect to both. In addition, it should be understood that the number of biasing elements included in the biasing assembly W is not limited to the number in the embodiment.

The biasing assembly W connecting the plate 10 to the base 20 may be for example, a plurality of wires including shape memory alloy (SMA) materials, and can change the length of the biasing assembly W by applying driving signals (such as current) from an external power source (not shown). For example, when the biasing assembly W is heated by applying driving signals, the biasing assembly W can deform to elongate or shorten. When the driving signals are no longer applied, the biasing assembly W can be restored to its original length. In other words, by applying the appropriate driving signals, the length of the biasing assembly W can be controlled to force the base 20, and the first holder 31 and the second holder 32 (holding the optical elements) disposed over the base 20 to move relative to the plate 10 (in order to force the movable portion P to move relative to the plate 10), thereby changing the positions of the first holder 31 and the second holder 32, so that the optical element driving mechanism 1 has the functions of image stabilization and shake compensation.

Materials used in the biasing assembly W may include, for example, titanium nickel alloy (TiNi), titanium palladium alloy (TiPd), titanium nickel copper alloy (TiNiCu), titanium nickel palladium alloy (TiNiPd), or a combination thereof.

Referring to FIGS. 3 and 4, the elastic elements E (for example, plated springs) include metal materials and have substantially rectangular structures, and have protruding portions E13 connected to the base 20 and L-shaped arms E12 connected to the plate 10. The elastic elements E (for example, the arms E12 and the protruding portions E13) can be connected to the wires (not shown) formed on the plate 10 and the base 20. The wires can be formed on the plate 10 and/or the base 20 in the manner of insert molding or a 3D molded interconnect device technique, in such a way that the wires can be individually electrically connected to the aforementioned four first biasing elements W1 and four second biasing elements W2 using the elastic elements E to form eight independent circuits. Therefore, independent driving signals (such as current) can be individually applied to the first biasing elements W1 and the second biasing elements W2 by the external power source, so that the lengths of the first biasing elements W1 and the second biasing elements W2 are changed to force the base 20, the first holder 31, and the second holder 32 to move relative to the plate 10. It should be noted that the wires are formed on the plate 10 and/or the base 20 in the manner of insert molding or a 3D molded interconnect device technology. Therefore, additional wires can be reduced, such that the number of overall components of the optical element driving mechanism 1 is decreased, and the volume of the optical element driving mechanism 1 is significantly reduced.

As shown in FIG. 4, in terms of the first biasing elements W1, the first biasing elements W1 are individually disposed on four different lateral sides of the plate 10, and correspond to four lateral sides (FIG. 3) of the lower surface of the sub-base 21. One fixed portion 11 and one connecting portion E11 can be seen on each of the lateral sides of the plate 10. The first biasing elements W1 are connected to the fixed portions 11 and the connecting portions E11. To be more specific, two fixed portions 11 and two connecting portions E11 are disposed at four different corners of the sub-base 21 in a staggered configuration (that is, a connecting portion E11 and a fixed portion 11 may respectively be disposed at any two adjacent corners). In addition, the sub-base 21 with the appearance of a substantially rectangular structure has a diagonal N. The four underlying first biasing elements W1 and the connecting portions E11 of the elastic elements E are disposed to be substantially symmetrical to the diagonal N.

Similarly, the second biasing elements W2 are disposed between the plate 10 and the sub-base 22 in a configuration that is the same or similar to that of the first biasing elements W1. The second biasing elements W2 are connected to the fixed portions 11 of the plate 10 and the connecting portions E11 of the elastic elements E. As shown in FIGS. 3 and 4, one of the first biasing elements W1 and one of the second biasing elements W2 are disposed on a side of the plate 10, and the long axes of the first biasing element W1 and the second biasing element W2 disposed on the side of the plate 10 are parallel to each other. In addition, the first electromagnetic driving assembly MC1 (FIG. 2) is electrically connected to the sub-base 21 at the two corners (first electrical connection junctions) of the sub-base 21, that is, directly over the protruding portions E13. The second electromagnetic driving assembly MC2 (FIG. 2) is electrically connected to the sub-base 22 at the two corners (second electrical connection junctions) of the sub-base 22, that is, directly over the protruding portions E13. The connecting line of the two first electrical connection junctions at the corners of the sub-base 21 is substantially parallel to the connecting line of the two second electrical connection junctions at the corners of the sub-base 22.

Referring to FIG. 3, when appropriate driving signals are applied to the biasing assembly W, the biasing assembly W will change its shape (for example, elongating or shortening). As a result, the base 20, the first holder 31, and the second holder 32 (and the optical components carried by the first holder 31 and the second holder 32) are forced to move relative to the plate 10 which is fixed to the casing of the electronic device. Therefore, the function of optical image stabilization is achieved.

The movement of the first holder 31, the second holder 32, and the base 20 relative to the plate 10 may include the linearly moving of the first holder 31 and the sub-base 21 (and/or the second holder 32 and the sub-base 22) in a direction that is substantially perpendicular to the central axis Q relative to the plate 10, and the rotating of the first holder 31 and the sub-base 21 around the optical axis O1 relative to the plate 10 (and/or the rotating of the second holder 32 and the sub-base 22 around the optical axis O2 relative to the plate 10). As a result, by controlling the deformation of the multiple biasing elements disposed on different lateral sides of the plate 10, the first holder 31 and the second holder 32 disposed on the base 20 can be forced to move on a plane (XY-plane) that is substantially perpendicular to the central axis Q of the plate 10. Therefore, the effect of shake compensation is obtained. In addition, the plate 10 and the base 20 are connected by the elastic elements E, therefore, when a driving signal is not applied to the biasing assembly W, the first holder 31, the second holder 32, and the base 20 can remain in the initial position relative to the plate 10 by the elastic elements E.

Figure 5:
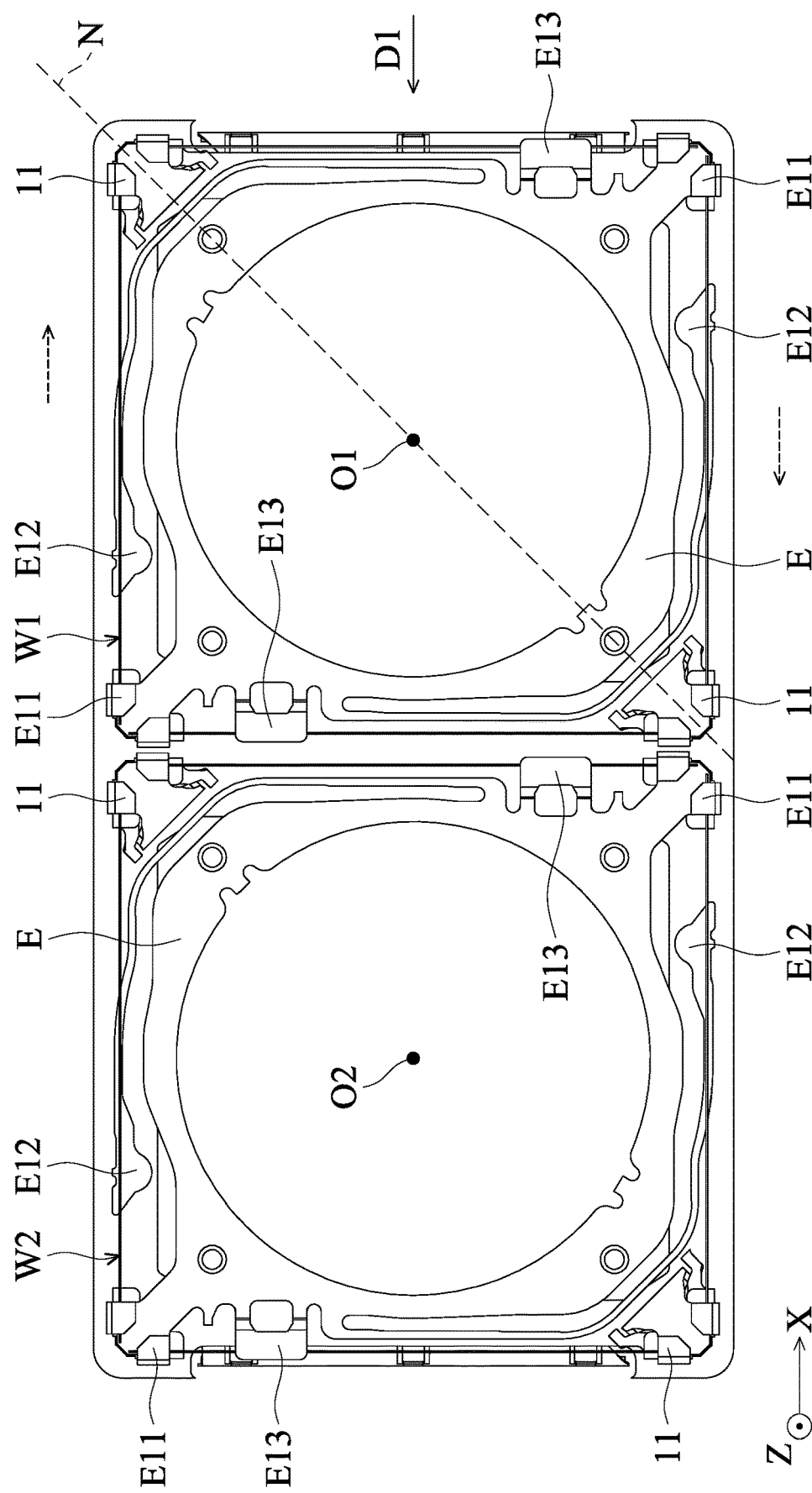
FIG. 5 is a schematic view illustrating that the biasing assembly deforms to force the first holder to linearly move in the direction D1.
Figure 6:
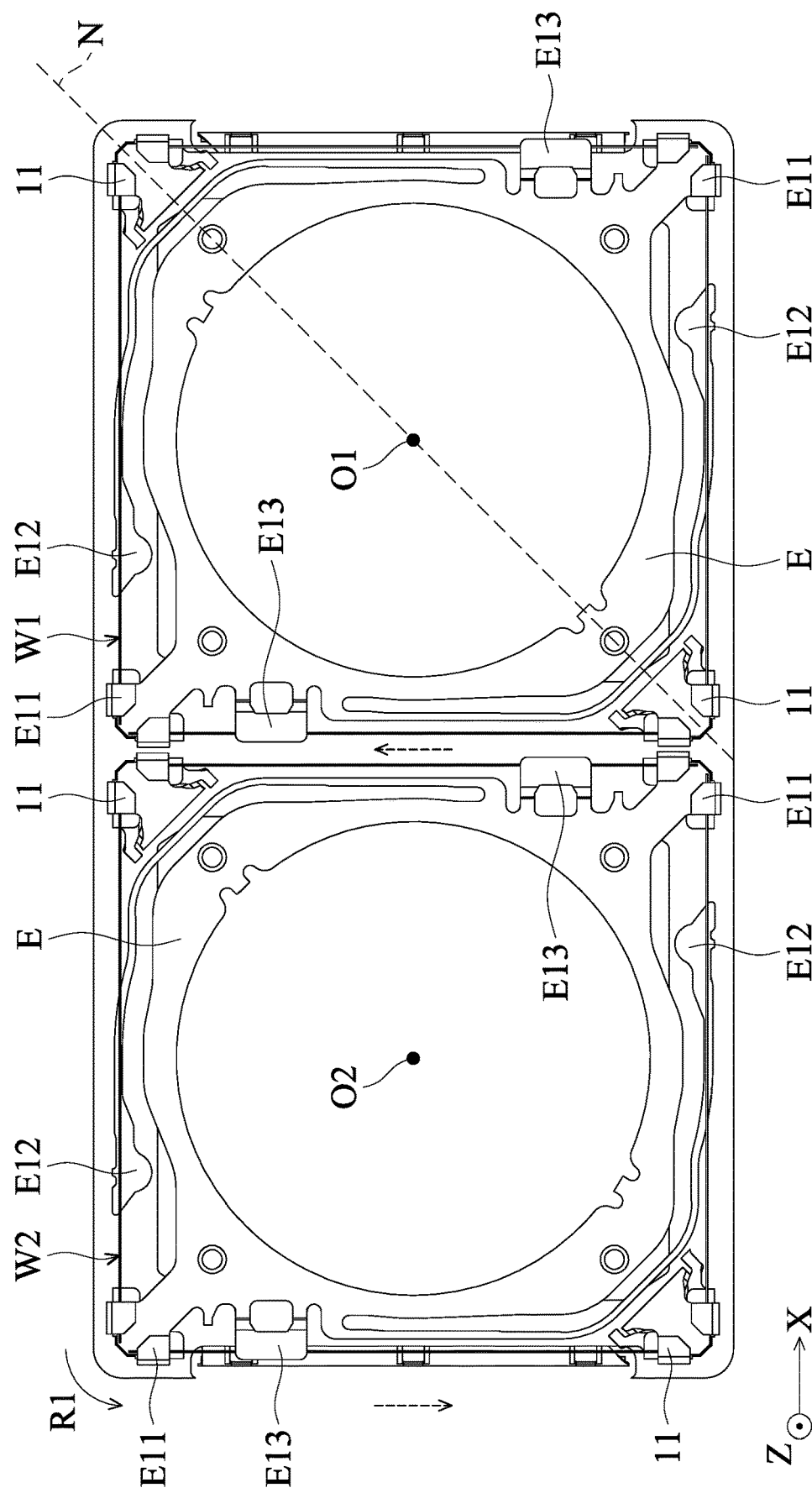
FIG. 6 is a schematic view illustrating that the biasing assembly deforms to force the second holder to rotate in the direction R1.

With respect to the aforementioned movement of the first holder 31, the second holder 32, and the base 20, for example, as shown in FIG. 5, when appropriate driving signals are applied to the first biasing element W1 in the upper part of FIG. 5 and the first biasing element W1 in the lower part of FIG. 5, and the upper and lower first biasing elements W1 are respectively forced to elongate and shorten (for example, in the directions indicated by the dotted arrows in FIG. 5), the first holder 31 and the sub-base 21 (FIGS. 1-2) disposed over the first biasing elements W1 are forced to linearly move in the direction perpendicular to the central axis Q (such as direction D1 in FIG. 5). Similarly, as shown in FIG. 6, when appropriate driving signals are applied to the left and right second biasing elements W2 and shorten the left and right second biasing elements W2 (for example, in the direction of the dotted arrow in FIG. 6), the second holder 32 and the sub-base 22 are forced to rotate relative to the plate 10 around the optical axis O2 (such as direction R1 in FIG. 6).

It should be noted that the first biasing elements W1 and the second biasing elements W2 are individually applied for driving signals. Therefore, the first holder 31 and the second holder 32 can show compensation positions relative to the plate 10 that are different or the same. For example, appropriate different driving signals are applied to the first biasing elements W1 and the second biasing elements W2, such that the first holder 31 is forced to linearly move relative to the plate 10, and the second holder 32 is forced to rotate relative to the plate 10 (or it linearly moves in a different direction than the moving direction of the first holder 31). Alternatively, the first holder 31 and the second holder 32 are forced to linearly move or rotate together relative to the plate 10, so that the goal of providing great optical shake compensation can be achieved.

Furthermore, in another embodiment, only one first biasing element W1 can be disposed on each of the lateral sides of the sub-base 21 (or the plate 10), and one second biasing element W2 can also be disposed on each of the lateral sides of the sub-base 22 (or the plate 10). Corresponding guiding mechanisms, such as corresponding grooves for the sub-bases 21 and 22 to move along, can be disposed to force the base 20, the first holder 31, and the second holder 32 to linearly move or rotate relative to the plate 10.

Figure 7:
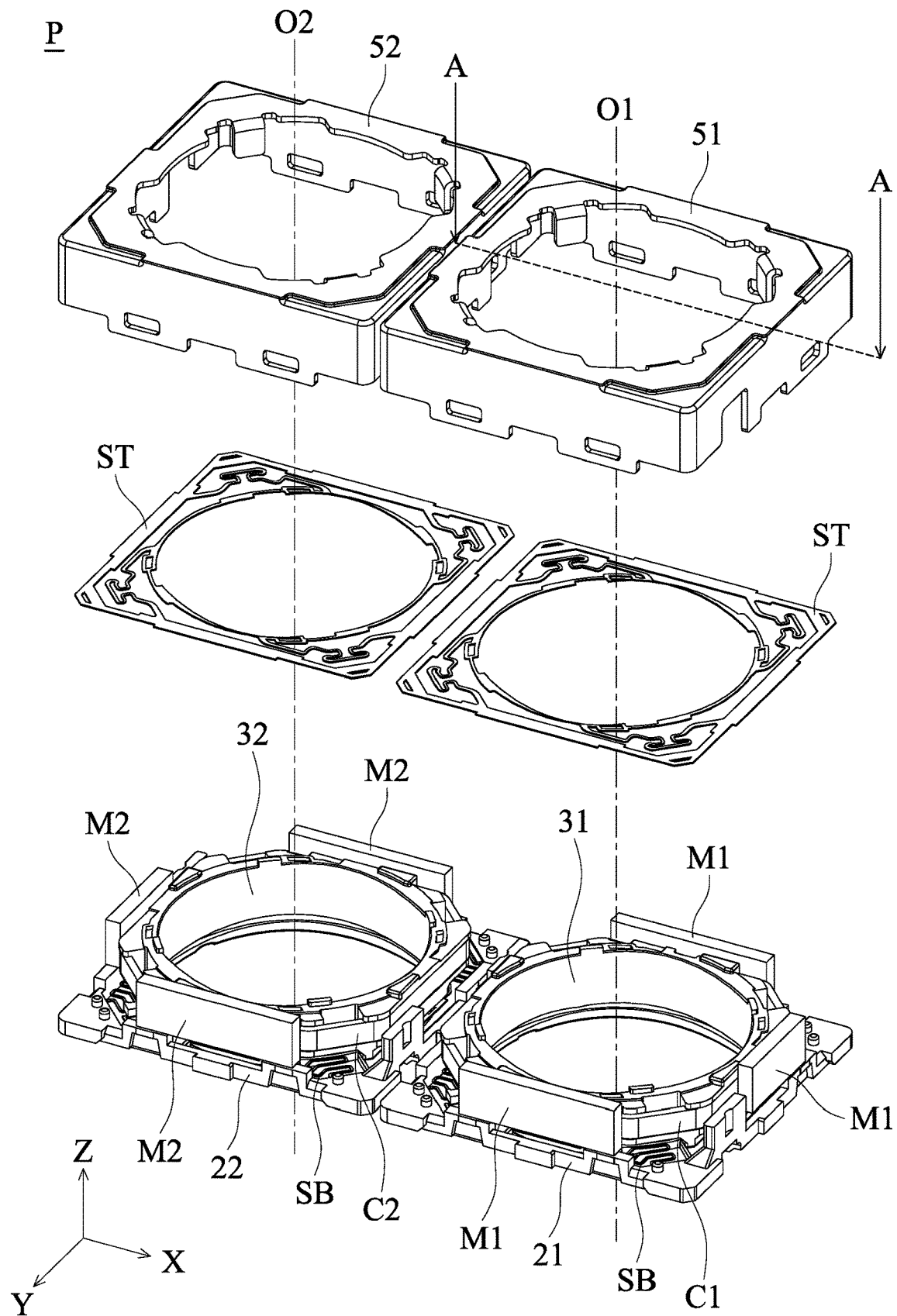
FIG. 7 is a schematic view illustrating a movable portion P in FIG. 2.

The connection relationship of the first holder 31 and the second holder 32 in the movable portion P and the base 20 will be described as follows. As shown in FIGS. 2 and 7, the first holder 31 is disposed on the sub-base 21 of the base 20, and the second holder 32 is disposed on the sub-base 22 of the base 20, and each of the first holder 31 and the second holder 32 can be used to hold an optical element (such as an optical lens), such that the optical element driving mechanism 1 is a mechanism that holds dual optical elements.

Figure 8:
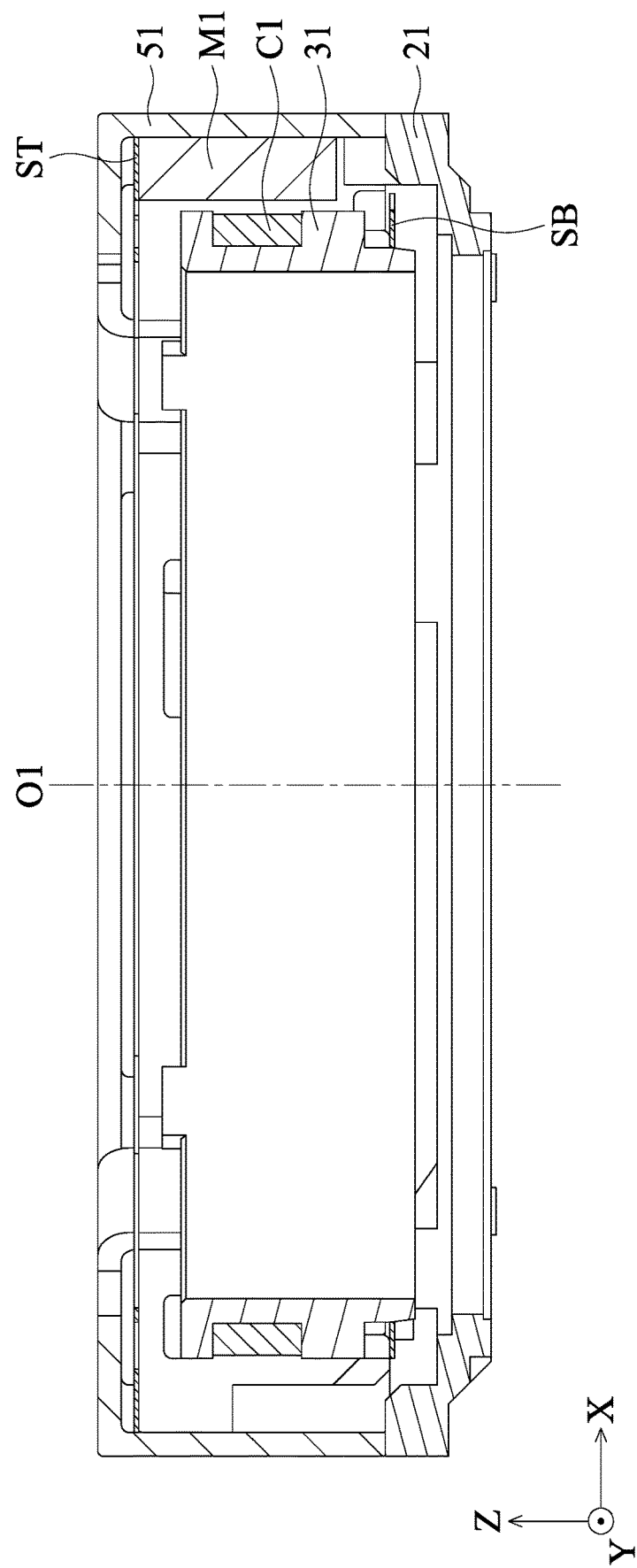
FIG. 8 is a cross-sectional view illustrating the movable portion P in FIG. 7 along line A-A after assembly.

Referring to FIGS. 7 and 8, the first holder 31 is disposed between a lower leaf spring SB and an upper leaf spring ST, and connected to the sub-base 21 in a movable manner by the lower leaf spring SB. The first electromagnetic driving assembly MC1 includes a first coil C1 and a plurality of first magnetic elements M1 (such as magnets), wherein the first coil C1 is disposed around the first holder 31. Three first magnetic elements M1 are disposed on different inner lateral sides of the housing 51 (or connected to the upper leaf spring ST), and facing the first coil C1. In the embodiment, the first coil C1 can receive driving signals (such as currents) applied by an external power source (not shown), so that a magnetic force can be provided between the first coil C1 and the first magnetic elements M1 to force the first holder 31 and the optical element disposed therein to move relative to the base 20 and the plate 10 in the direction (Z-axis) of the optical axis O1 of the optical element and/or the central axis Q, such that the function of auto-focusing is achieved. Alternatively, when the shaking of the optical elements occurs, a great compensation effect can be obtained by the aforementioned moving mechanism. Therefore, high-quality images can be captured, and the goal of optical image stabilization is achieved. In addition, before driving signals are applied, the upper leaf spring ST and the lower leaf spring SB can hold the first holder 31 to remain in an initial position relative to the base 20.

Similarly, the second holder 32 is also connected to the sub-base 22 in a configuration that is the same or similar to that of the first holder 31. The second holder 32 is forced to move relative to the sub-base 22 and the plate 10 in the direction (Z-axis) of the optical axis O2 of the optical element and/or the central axis Q by the second electromagnetic driving assembly MC2 (including a second coil C2 and a plurality of second magnetic elements M2).

A detailed description of the first electromagnetic driving assembly MC1 and the second electromagnetic driving assembly MC2, as shown in FIGS. 7 and 8, is provided. The first magnetic elements M1 are disposed around the first holder 31, and the second magnetic elements M2 are disposed around the second holder 32. The first coil C1 is disposed around the first holder 31, and the second coil C2 is disposed around the second holder 32. It should be noted that there is not a magnetic element disposed between the first holder 31 and the second holder 32. Therefore, the distance between the first holder 31 and the second holder 32 can be reduced. As a result, the overall volume of the optical element driving mechanism 1 can also be reduced. In an embodiment, the aforementioned distance is less than the thickness of the first magnetic elements M1 and the thickness of the second magnetic elements M2. In addition, in an embodiment, an electromagnetic-wave-resist board (for example, including an aluminum material) is buried or embedded in the plate 10. The electromagnetic interference generated by the several coils and magnetic elements overlying the plate 10 that interferes with the other electronic elements in the electronic device can be blocked or reduced by the electromagnetic-wave-resist board. Therefore, the quality of the device is improved.

Figure 9:
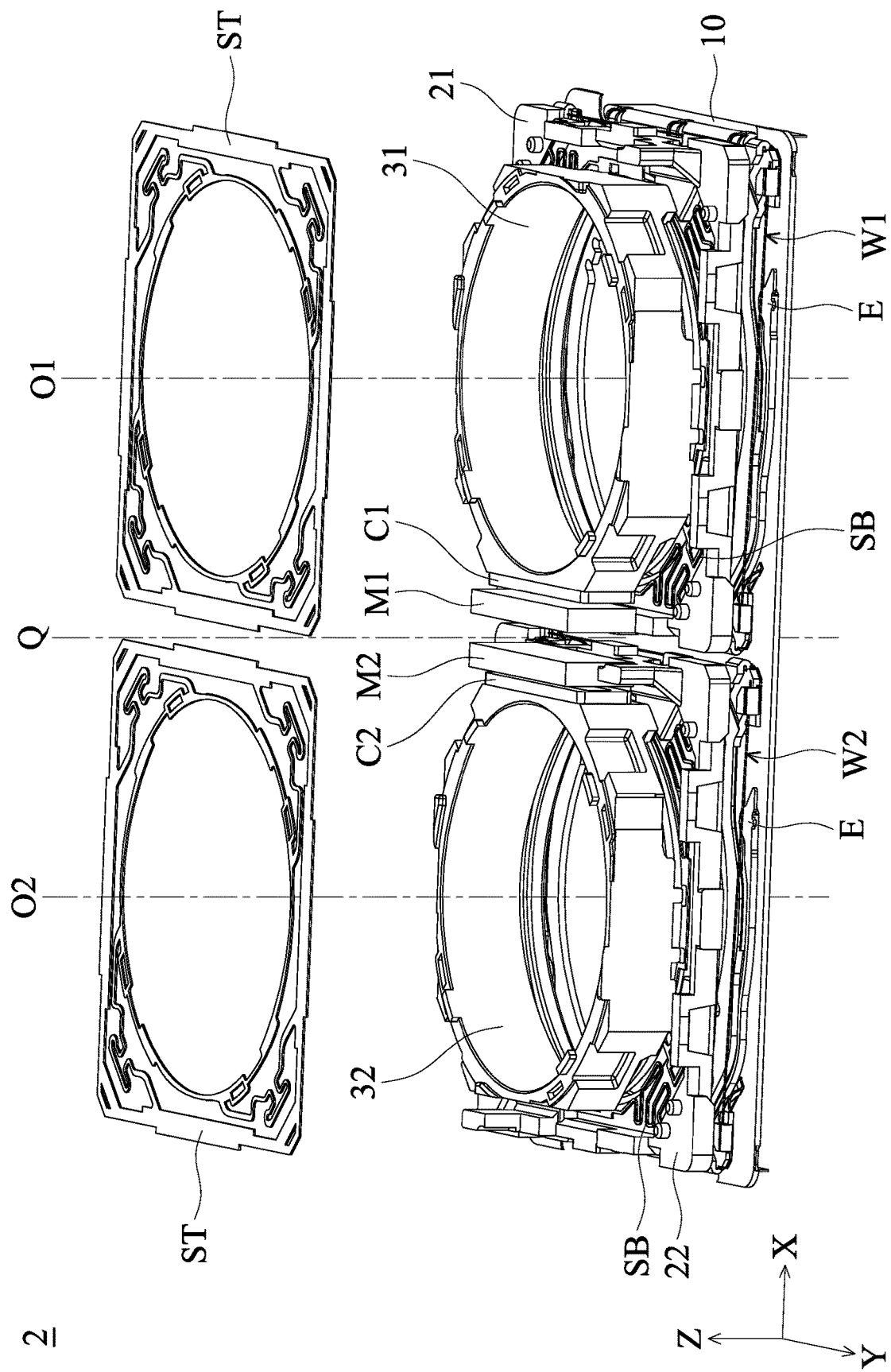
FIG. 9 is a schematic view illustrating an optical element driving mechanism in another embodiment of the present disclosure.

FIG. 9 is a schematic view illustrating an optical element driving mechanism 2 in another embodiment of the present disclosure. The main difference between the optical element driving mechanism 2 in the embodiment and the optical element driving mechanism 1 is that each of the first electromagnetic driving assembly MC1 and the second electromagnetic driving assembly MC2 of the optical element driving mechanism 2 only includes one first magnetic element M1 disposed corresponding to the first coil C1 overlying the first holder 31 and one second magnetic element M2 disposed corresponding to the second coil C2 overlying the second holder 32. The other components of the optical element driving mechanism 2 are substantially the same, or they are corresponding to that of the aforementioned optical element driving mechanism 1 (FIGS. 1-2). Therefore, the other components are not described in detail here again, and the housings 51 and 52 can be configured.

As shown in FIG. 9, the first magnetic element M1 is disposed on the inner surface of the housing 51 (see FIG. 7), and facing the first coil C1. The second magnetic element M2 is disposed on the inner surface of the housing 52 (see FIG. 7), and facing the second coil C2. Both the first magnetic element M1 and the second magnetic element M2 are only disposed between the first holder 31 and the second holder 32. Therefore, the overall volume of the optical element driving mechanism 2 can be significantly reduced. Furthermore, because only one magnetic element is disposed on one side of the first holder 31, and only one magnetic element is disposed on one side of the second holder 32, the occurrence of the other electronic elements in the electronic device experiencing electromagnetic interference caused by too many magnetic elements can be reduced.

Figure 10:
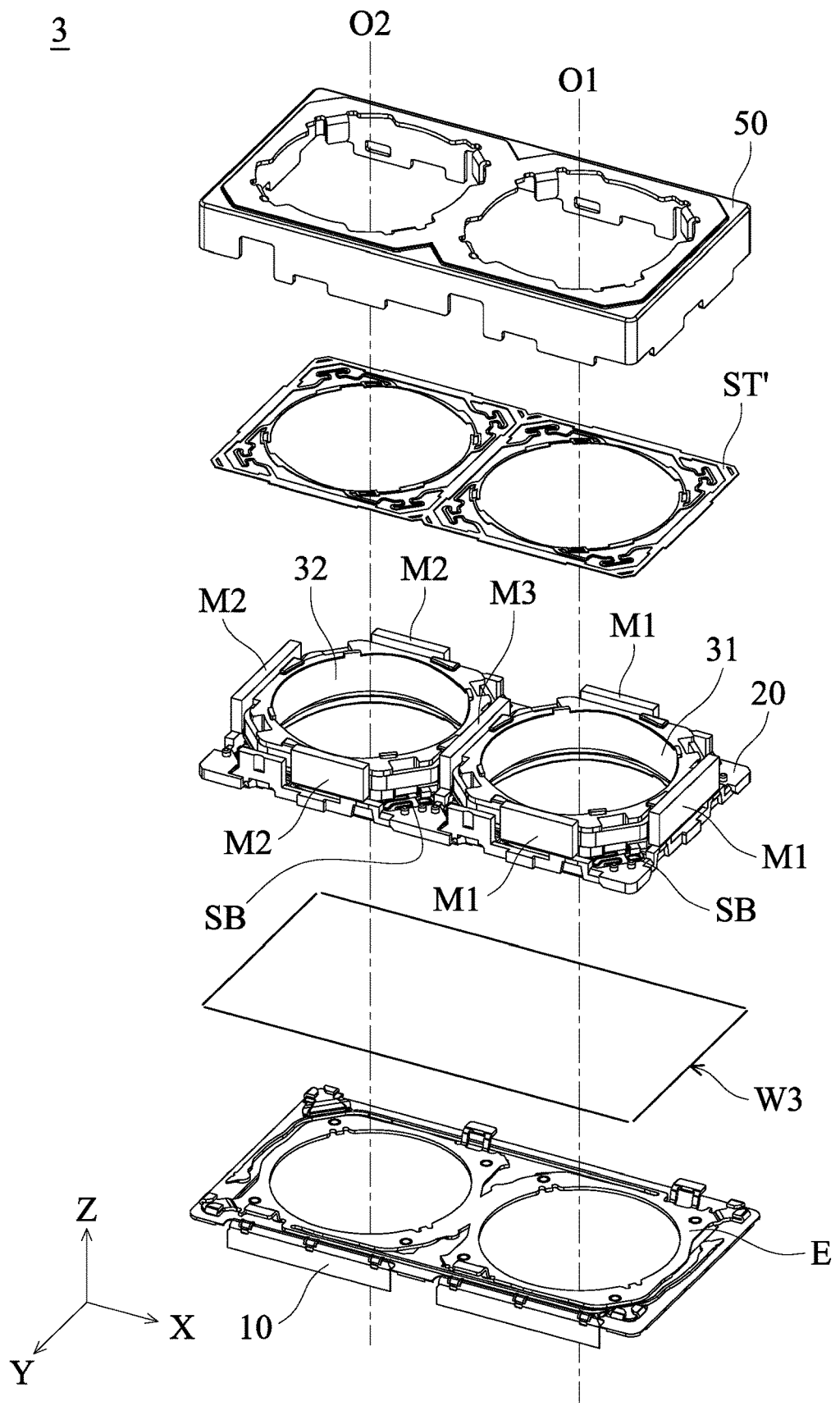
FIG. 10 is a schematic view illustrating an optical element driving mechanism in another embodiment of the present disclosure.

FIG. 10 is a schematic view illustrating an optical element driving mechanism 3 in another embodiment of the present disclosure. The main difference between the optical element driving mechanism 3 in the embodiment and the optical element driving mechanism 1 is that the optical element driving mechanism 3 further includes a common magnetic element M3. The base 20 has a substantially rectangular structure and is not divided into several sub-bases. The biasing assembly W only includes four third biasing elements W3, wherein an elastic element E connects the plate 10 with the base 20. The other components of the optical element driving mechanism 3 are substantially the same, or they correspond to that of the optical element driving mechanism 1 (FIGS. 1-2). There is just a slight difference in appearance.

As shown in FIG. 10, the four third biasing elements W3 are respectively configured on four lateral sides of the plate 10 and/or the base 20 to connect the plate 10 with the elastic element E (wherein the elastic element E is connected to the base 20). The third biasing elements W3 are around the first holder 31 and the second holder 32. When appropriate driving signals are applied and force each of the third biasing elements W3 to shorten or elongate individually, the first holder 31 and second holder 32 can be forced to linearly move or rotate together relative to the plate 10, thereby the function of lens-shake compensation is achieved.

In addition, each of the magnetic elements M1, M2, and M3 is configured around the first holder 31 and the second holder 32 (wherein the first magnetic elements M1 and the second magnetic elements M2 are disposed on the inner surface of the housing 50, and the common magnetic element M3 is disposed on the upper leaf spring ST' with the appearance of a substantial rectangle). Therefore, at least four magnetic elements are disposed around the first holder 31 and the second holder 32, wherein the common magnetic element M3 is disposed between the first holder 31 and the second holder 32, and the left and right sides (opposite sides) of the common magnetic element M3 are facing the first coil C1 and the second coil C2. Therefore, when the first coil C1 and the second coil C2 receive driving signals, the first coil C1 and the second coil C2 can generate magnetic force with the first magnetic elements M1, the second magnetic elements M2, and the common magnetic element M3. The driving force for forcing the first holder 31 and the second holder 32 to move relative to the plate 10 and the base 20 is thereby increased. Furthermore, the quantity of the magnetic elements disposed in the optical element driving mechanism 3 is also reduced (only one common magnetic element M3 is disposed between the first holder 31 and the second holder 32).

In summary, the embodiments of the disclosure provide an optical element driving mechanism. The optical element driving mechanism mainly includes a plate, a base, a first holder, a second holder, and a biasing assembly. The plate is fixed to the casing of an electronic device. The first holder and the second holder are respectively used to hold an optical element, and are disposed on the base. The biasing assembly is connected to the plate and the base, and forces the base, the first holder, and the second holder to move relative to the plate. The function of optical focusing and optical shake compensation can thereby be achieved. In addition, the optical element driving mechanism further includes at least an electromagnetic driving assembly disposed on the base. When driving signals are applied to the electromagnetic driving assembly, the first holder and/or the second holder and the optical elements disposed therein can be forced to move relative to the base and the plate, such that the optical element driving mechanism has better optical shake compensation, thereby improving the image quality.

It should be understood that there is no relationship in a sequence between the ordinal numbers in the present specification and claims, such as "first", "second" etc. These terms are only used to distinguish two different elements with the same name.

The aforementioned embodiments are adequately described in detail for those skilled in the art to perform the device of the present disclosure. It should be understood that those skilled in the art may make various changes and modifications to the invention without departing from the spirit and scope of the present disclosure. Therefore, the scope of the present disclosure is defined according to the following claims.

What is claimed is:

1. An optical element driving mechanism, comprising:
   a first holder configured to hold a first optical element with a first optical axis;
   a second holder configured to hold a second optical element with a second optical axis;
   a plate disposed below the first holder and the second holder;
   a base disposed between the first holder, the second holder, and the plate, wherein the base comprises a first sub-base and a second sub-base;
   a plurality of elastic elements disposed on the plate and positioned between the plate and the base;
   a biasing assembly, configured to generate a first driving force that does not comprise a force at a distance to force the first holder to move relative to the plate in a first direction perpendicular to the first optical axis, comprising a plurality of biasing elements, wherein the biasing elements are located on different sides of the plate, wherein the biasing elements comprise a memory alloy material, when a driving signal is applied to the biasing elements, temperatures of the biasing elements and lengths of the biasing elements are changed individually, and the length is measured in the first direction, the biasing assembly is not electrically connected to any electromagnetic assembly; and
   an electromagnetic driving assembly configured to force the second holder to move relative to the plate and comprising a first magnetic element and a coil,
   wherein when viewed in the first optical axis, the biasing assembly is at least partially located between the first optical axis and the second optical axis, and a connecting line between the first optical axis and the second optical axis passes through the biasing assembly;
   wherein two ends of the biasing assembly are each connected to the plate and the elastic elements.

2. The optical element driving mechanism as claimed in claim 1, further comprising:
   a first housing, configured to contain the first holder, comprising:
      a first top surface;
      a first side surface extending from an edge of the first top surface in a direction that is different from an extending direction of the first top surface; and
   a second housing, configured to contain the second holder, comprising:
      a second top surface;
      a second side surface extending from an edge of the second top surface in a direction that is different from an extending direction of the second top surface, wherein as viewed in a direction that the first holder and the second holder are arranged, the first holder, the second holder, the first side surface, and the second side surface partially overlap.

3. The optical element driving mechanism as claimed in claim 2, wherein the first top surface and the second top surface are not in contact, and a gap is formed between the first top surface and the second top surface.

4. The optical element driving mechanism as claimed in claim 2, wherein as viewed in a direction that the first holder and the second holder are arranged, the second housing and the electromagnetic driving assembly partially overlap, and the second housing and the biasing assembly do not overlap.

5. The optical element driving mechanism as claimed in claim 1, wherein as viewed in a direction that is parallel to the first optical axis, the biasing assembly is at least partially located between the first optical axis and the second optical axis, and as viewed in a direction that the first holder and the second holder are arranged, the first optical axis and the second optical axis partially overlap with the biasing assembly.

6. The optical element driving mechanism as claimed in claim 5, wherein as viewed in a direction that is parallel to the first optical axis, the biasing element is at least partially located between the first optical axis and the second optical axis, and as viewed in the direction that the first holder and the second holder are arranged, the first optical axis and the second optical axis partially overlap with the biasing element.

7. The optical element driving mechanism as claimed in claim 6, wherein the first magnetic element has an elongated structure extending along the direction that the first holder and the second holder are arranged.

8. The optical element driving mechanism as claimed in claim 7, wherein the second holder has a polygonal structure, the electromagnetic driving assembly further comprises a second magnetic element, and the first magnetic element and the second magnetic element are disposed on different sides of the second holder.

9. The optical element driving mechanism as claimed in claim 8, wherein a volume of the first magnetic element is different from a volume of the second magnetic element.

10. The optical element driving mechanism as claimed in claim 9, wherein the volume of the first magnetic element is greater than the volume of the second magnetic element.

11. The optical element driving mechanism as claimed in claim 1, wherein the biasing assembly is configured to force the first holder to move relative to the plate in the first direction, the electromagnetic driving assembly is configured to force the second holder to move relative to the plate in a second direction, and the first direction is not parallel to the second direction.

12. The optical element driving mechanism as claimed in claim 1, wherein the first optical axis is separated from the second optical axis.

13. The optical element driving mechanism as claimed in claim 1, wherein there is a distance between the first holder and the second holder, and the distance is shorter than a thickness of the first magnetic element.

14. The optical element driving mechanism as claimed in claim 1, wherein the first holder is disposed on the first sub-base, and the second holder is disposed on the second sub-base.

15. The optical element driving mechanism as claimed in claim 14, wherein the first sub-base and the second sub-base are individually movable relative to the plate.

16. The optical element driving mechanism as claimed in claim 1, wherein the elastic elements each have an L-shaped arm and a protruding portion, the L-shaped arm is connected to the plate, and the protruding portion is connected to the base.

17. The optical element driving mechanism as claimed in claim 16, wherein the plate has a rectangular structure and a fixed portion, the elastic elements each have a connecting portion, the fixed portion and the connecting portion are disposed on the same side of the plate, and the biasing assembly is connected to the fixed portion and the connecting portion.

18. The optical element driving mechanism as claimed in claim 1, further comprising a board disposed in the plate, wherein the board includes aluminum material.

19. The optical element driving mechanism as claimed in claim 1, wherein the connecting line does not overlap with the first magnetic element.

* * * * *